US005346401A

United States Patent [19]
Delianides et al.

[11] Patent Number: 5,346,401
[45] Date of Patent: Sep. 13, 1994

[54] ELECTRICAL CONNECTOR FOR TRANSLATING BETWEEN FIRST AND SECOND SETS OF TERMINALS HAVING DIFFERENT PITCHES

[75] Inventors: John Delianides, Lake Worth; Cindy L. Davis, Boynton Beach, both of Fla.

[73] Assignee: Motorola, Inc., Schaumburg, Ill.

[21] Appl. No.: 51,138

[22] Filed: Apr. 22, 1993

[51] Int. Cl.$^5$ .............................................. H01R 9/09
[52] U.S. Cl. ................................................. 439/67
[58] Field of Search ...................... 439/67, 77, 66, 91, 439/68, 493; 174/84 R, 88 R, 94 R, 117 FF, 254, 262–266

[56] References Cited

U.S. PATENT DOCUMENTS

| 3,597,660 | 8/1971 | Jensen | 439/67 |
| 4,993,954 | 2/1991 | Prevost | 439/68 |

FOREIGN PATENT DOCUMENTS

| 2031215 | 3/1974 | Fed. Rep. of Germany | 439/402 |
| 2-12890 | 1/1990 | Japan | 439/67 |
| 2159007 | 11/1985 | United Kingdom | 439/66 |

OTHER PUBLICATIONS

IBM Technical Disclosure, Johnson, vol. 21, No. 6, p. 2320, Nov. 1978.

*Primary Examiner*—Neil Abrams
*Attorney, Agent, or Firm*—Kelly A. Gardner; Thomas G. Berry

[57] ABSTRACT

An electrical connector (100) for translating from a first plurality of interconnects (108) formed at a first pitch to a second plurality of interconnects (125) formed at a second pitch smaller than the first pitch comprises a first heat seal connector (105), which includes the first plurality of interconnects (108), and a second heat seal connector (120), which includes the second plurality of interconnects (125). The electrical connector (100) further comprises a translation circuit (110), which includes a first set of outer terminals (115) formed at the first pitch, wherein the first set of outer terminals (115) is aligned with and electrically coupled to the first plurality of interconnects (108). The translation circuit (110) further includes a second set of outer terminals (548) formed at the second pitch, wherein the second set of outer terminals (548) is aligned with and electrically coupled to the second plurality of interconnects (125). Connection circuitry (510–545) electrically couples the first and second sets of outer terminals (115, 548).

17 Claims, 3 Drawing Sheets

ELECTRICAL CONNECTOR FOR TRANSLATING BETWEEN FIRST AND SECOND SETS OF TERMINALS HAVING DIFFERENT PITCHES

FIELD OF THE INVENTION

This invention relates in general to electrical connectors, and more specifically to an electrical connector for translating from a first set of terminals having a first pitch to a second set of terminals having a second pitch smaller than the first pitch.

BACKGROUND OF THE INVENTION

Electrical connectors are well known in the art. One type of conventional electrical connector is a heat seal connector, which allows the flexible interconnection of a first electrical component to a second electrical component. Heat seal connectors typically comprise a flexible substrate formed from a polymer material such as mylar. Graphite interconnects are printed onto the heat seal connector to provide electrical coupling from the first electrical component, which is heat sealed to the interconnects at a first edge of the connector, to the second electrical component, which is heat sealed to the interconnects at a second edge of the connector.

Such a flexible interconnection is especially useful in smaller consumer devices, e.g., selective call receivers, in which space is of primary consideration, because the flexible interconnection allows the coupled electrical components to be arranged into a position in which the available space is efficiently utilized. For example, in credit card-type selective call receivers, which are extremely small, a heat seal connector is utilized to electrically couple the terminals of a liquid crystal display (LCD) to corresponding terminals of a printed circuit board. Because it is flexible, the heat seal connector can be folded such that the LCD is positioned parallel to the printed circuit board, thereby efficiently utilizing the small amount of interior space. Additionally, the heat seal connector, similar to other electrical connectors, can be utilized to translate from a larger pitch termination, e.g., the LCD terminals, to a smaller pitch termination, e.g., the printed circuit board terminals. This allows the printed circuit board terminals to be designed as small and as closely together as current design guidelines permit, thereby efficiently utilizing-the space on the printed circuit board.

A drawback, however, to the use of heat seal connectors, which are typically one-layer connectors, is the fact that a relatively large amount of area, which is dictated by the limitations of existing manufacturing equipment, is necessary to translate from a larger pitch termination to a smaller pitch termination. This large amount of area is dictated both by the limitations of existing manufacturing equipment and by the amount of bending to which the heat seal connector is exposed during manufacturing and assembly. It would be unwise, for example, to form graphite interconnects at extreme angles if the heat seal connector is to be flexed often or secured in a position which stresses the interconnects. As a result, heat seal connectors employed to electrically couple a larger pitch termination to a smaller pitch termination often include surplus connector material, the sole purpose of which is to effect the translation between the different pitches. This surplus connector material must then be accommodated by an electronic device, which, as described above, may include only a limited amount of space for components.

Thus, what is needed is an electrical connector which is flexible, yet does not require a large amount of area for translation from a larger pitched termination to a smaller pitched termination.

SUMMARY OF THE INVENTION

An electrical connector for translating from different sized connections comprises a first heat seal connector having a first plurality of interconnects formed at a first pitch, a second heat seal connector having a second plurality of interconnects formed at a second pitch smaller than the first pitch, and a translation circuit. The translation circuit includes a first outer layer on which a first set of outer terminals is formed at the first pitch for aligning with and electrically coupling to the first plurality of interconnects. A second outer layer of the translation circuit has a second set of outer terminals formed at the second pitch for aligning with and electrically coupling to the second plurality of interconnects. A first inner layer of the translation circuit interconnects a first outer terminal subset and a second outer terminal subset, wherein the first outer terminal subset comprises a first portion of the first set of outer terminals and the second outer terminal subset comprises a first portion of the first set of outer terminals. A second inner layer of the translation circuit interconnects a third outer terminal subset and a fourth outer terminal subset, wherein the third outer terminal subset comprises a second portion of the first set of outer terminals and the fourth outer terminal subset comprises a second portion of the second set of outer terminals.

DESCRIPTION OF A PREFERRED EMBODIMENT

Figure 1:
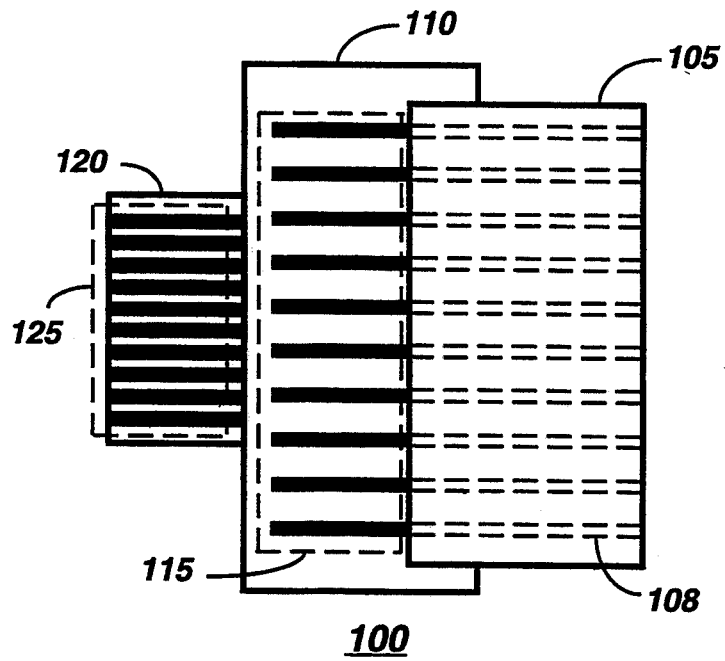
FIG. 1 is a top view of an electrical connector including first and second heat seal connectors electrically coupled by a translation circuit in accordance with the preferred embodiment of the present invention.
Figure 2:
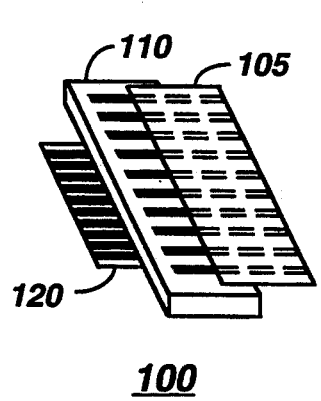
FIG. 2 is a perspective view of the electrical connector of FIG. 1 in accordance with the preferred embodiment of the present invention.
Figure 3:
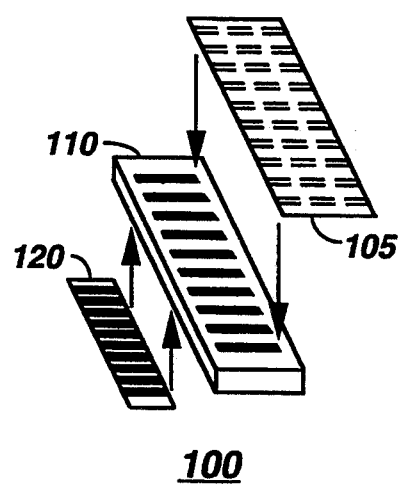
FIG. 3 is an exploded view of the electrical connector of FIG. 1 in accordance with the preferred embodiment of the present invention.

FIGS. 1, 2, and 3 show, in respective top, perspective, and exploded views, an electrical connector 100 according to the present invention. The electrical connector 100 comprises a first heat seal connector 105 having a plurality of interconnects 108 (each shown in dashed lines) formed thereon at a first pitch. The first heat seal connector 105 is electrically coupled to a translation circuit 110, which can be, for example, a rigid printed circuit board or a flexible circuit. The translation circuit 110 includes a set of outer terminals 115 which are formed at the same pitch as the plurality of interconnects 108 formed on the first heat seal connector 105. The set of outer terminals 115 is aligned with and electrically coupled to the plurality of interconnects 108 in a conventional manner, e.g., through the use of applied heat and pressure to form a bond. The set of outer terminals 115 and the plurality of interconnects 108 are preferably bonded using a well known technique in which a heat bar is utilized to apply pressure thereto.

The primary purpose of the translation circuit 110 is the translation from the first set of outer terminals 115, which are formed at a first pitch on a top outer layer of the translation circuit 110, to a second set of outer terminals (not shown), which are formed on the bottom outer layer of the translation circuit 110 and electrically coupled to the first set of outer terminals 115 by connection circuitry included within the translation circuit 110. Additionally, the second set of outer terminals are formed at a second pitch smaller than the first pitch. In other words, each of the second set of outer terminals may be, for example, constructed smaller and closer together than the terminals included in the first set of outer terminals 115.

The electrical connector 100 further comprises a second heat seal connector 120, on which is formed a second plurality of interconnects 125 at the second pitch, i.e., the same pitch at which the second set of outer terminals is formed. The second plurality of interconnects 125 is aligned with and electrically coupled to the second set of outer terminals formed on the bottom outer layer of the translation circuit 110. Preferably, the second plurality of interconnects 125 and the second set of outer terminals are bonded by the application of heat and pressure by a heat bar, as described above.

The first and second heat seal connectors 105, 120 are conventional heat seal connectors that are constructed using conventional heat seal technology. The base material of the heat seal connectors 105, 120 is preferably a mylar film on which the interconnects 108, 125, which are formed from graphite, are screen printed in a manner well known to one of ordinary skill in the art.

Figure 4:
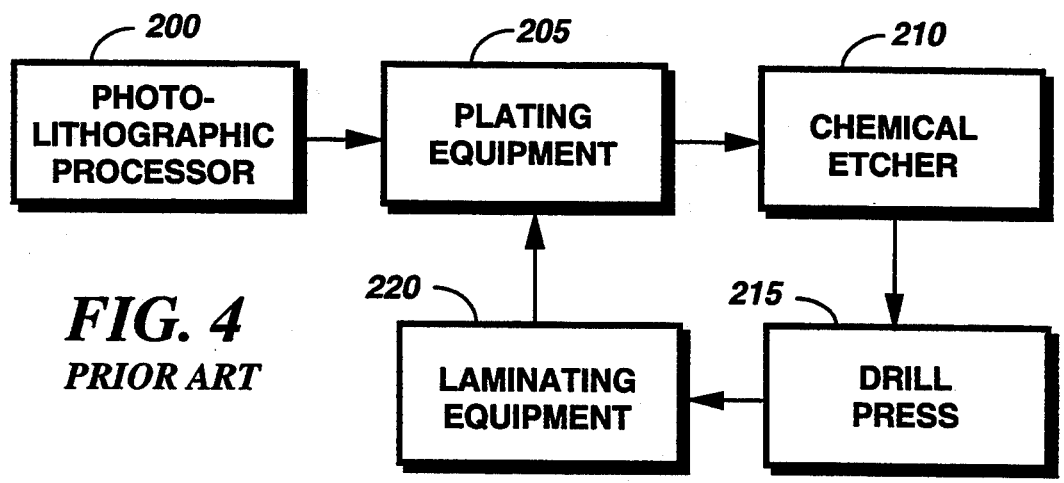
FIG. 4 is a flow diagram of a manufacturing process which can be utilized to construct the translation circuit of FIG. 1 in accordance with the preferred embodiment of the present invention.

The translation circuit 110 preferably comprises four or more layers, each of which is formed from a substrate processed in a conventional manner, an example of which is shown in the flow diagram of FIG. 4. Generally, a photo-lithographic processor 200 is employed to deposit patterns of a photo-imageable etch resist onto the substrate, which could be constructed, for example, of FR4 (a flame retardant classification) glass epoxy material when the translation circuit 110 is to be a rigid printed circuit board. Alternatively, when the translation circuit 110 is to be a flexible circuit, the substrate is formed from a flexible material such as polyimide. The substrate is thereafter plated by plating equipment 205 with a metal, such as one-half ounce copper covered with a hot-air-solder-leveled tin-lead alloy, for use in forming runners and metallized terminals, such as the outer terminals formed on the top and bottom layers of the translation circuit 110, which are not covered by the deposited etch resist. Next, the substrate passes to a chemical etcher 210, which etches surplus metal from the substrate with an etchant, e.g., ferric chloride, subsequent to which a drill press 215 is employed to drill via holes, which will later be used to provide electrical connections between different layers, in the substrate. The individual layers are thereafter assembled and laminated by laminating equipment 220, after which the plating equipment 205 is again utilized to plate the areas which are connected by the via holes.

Figure 5:
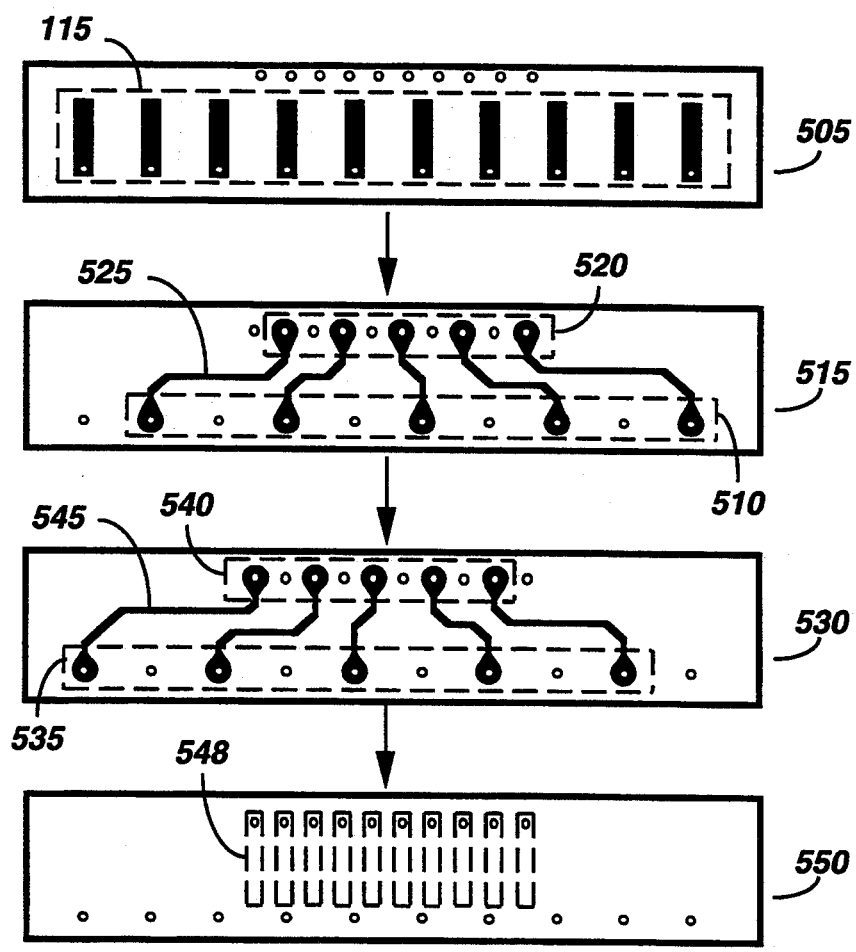
FIG. 5 is an exploded view of the translation circuit of FIG. 1 in accordance with the preferred embodiment of the present invention.

Referring next to FIG. 5, an exploded view of the translation circuit 110 depicts the different layers included in a four-layer translation circuit for translating between two sets of terminals formed at different pitches. As described above, a first layer 505, which is an outer layer, of the translation circuit 110 comprises a first set of outer terminals 115 formed at a first pitch. A portion, i.e., a first outer terminal subset, of the first set of outer terminals 115 is electrically coupled by via holes, as shown, to a first set of inner terminals 510 formed on a second layer 515, which is an inner layer. According to the present invention, the first set of inner terminals 510 is aligned with the first outer terminal subset to which it is electrically coupled. In addition to the first set of inner terminals 510, the second layer 515 comprises a second set of inner terminals 520, each of which is electrically connected to one of the first set of inner terminals 510 by a runner 525.

Similarly, a third layer 530 of the translation circuit 110 preferably comprises a set of inner terminals 535 which is coupled to the remaining portion, i.e., a second outer terminal subset, of the first set of outer terminals 115 by via holes. The third layer 530 further comprises a second set of inner terminals 540, each of which is electrically coupled by a runner 545 to one of the first set of inner terminals 535.

A fourth layer 550, which is a second outer layer, of the translation circuit 110 includes, as described and shown in reference to FIG. 1, a second set of outer terminals 548, which are shown in dashed lines. The second set of outer terminals 548 is formed at a second pitch, which is smaller than the pitch at which the first set of outer terminals 115 is formed on the first layer 505. A portion, i.e., a third outer terminal subset, of the second set of outer terminals 548 is coupled by via holes to the set of inner terminals 540 formed on the third layer 530, and the remaining portion, i.e., a fourth outer terminal subset, of the second set of outer terminals 548 is coupled to the set of inner terminals 520 formed on the second layer 515.

It will be appreciated that the utilization of the four layers 505, 515, 530, 550 are for illustrative purposes only and that a greater number of layers may be utilized when the number of outer terminals on the translation circuit 110 so dictates.

When the first and second heat seal connectors 105, 120 are assembled to the translation circuit 110, the result is an electrical connector 100 (FIG. 1) which is flexible and which can be assembled to electronic circuits utilizing a conventional heat seal connection process, thereby effecting the electrical coupling of the electronic circuits. Additionally, the electrical connector 100 requires only a small distance in the x-direction to translate from a first pitch to a second pitch because the translation is effected by the translation circuit 100 rather than the heat seal connector interconnects 108, 125, which would need to be very long to translate from the first pitch to the second pitch. The translation circuit 100 advantageously requires only a small distance to translate between the two pitches because the translation circuit 100, unlike conventional one-layer heat seal connectors, utilizes multiple layers to effect the translation. It will be appreciated that the above-mentioned features render the electrical connector 100 especially useful in small electronic devices in which space is at a premium and in which electronic circuits having terminals of different pitches must be interconnected.

Pagers, for example, are one type of small electronic device which continue to become smaller and more streamlined due to their portable nature. At the same time, pagers usually include a large number of desirable features to meet customer demand. For instance, many pagers include large display devices capable of displaying multiple lines of text, such as entire selective call messages. Because pagers have become smaller while display devices have become larger, unique approaches to pager assembly have had to be developed. One such approach is the use of a conventional heat seal connector to couple a display device, which typically has a large number of interconnects formed at a large pitch, to a printed circuit board having the same number of interconnects formed at a much smaller pitch, thereby efficiently utilizing the available space on the printed circuit board. This approach is often unfeasible, however, because extremely small pagers, such as credit card-type pagers, may be too thin to accommodate the large amount of heat seal material necessary to effect the translation between interconnects of different pitches. Therefore, the electrical connector 100, which translates between interconnects of different pitches in a small distance, is especially useful for applications in which space is of consideration.

Figure 6:
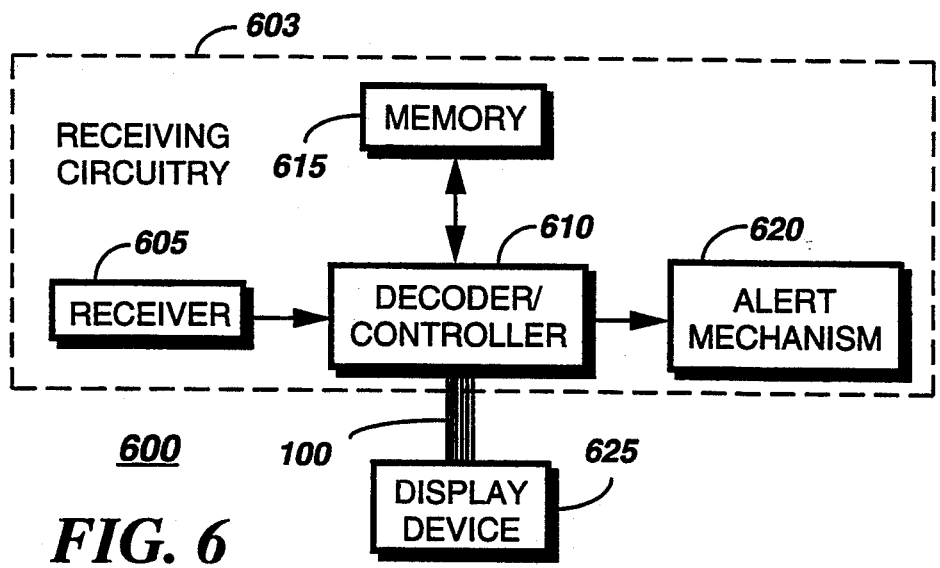
FIG. 6 is an electrical block diagram of an electronic device which utilizes the electrical connector of FIG. 1 to couple first and second electronic circuits in accordance with the preferred embodiment of the present invention.

FIG. 6 is an electrical block diagram of a small electronic device, more specifically, a radio communication device 600, which could benefit from the electrical connector 100 according to the present invention. The radio communication device 600, which could be, for example, a pager, includes receiving circuitry 603 mounted on a printed circuit board. The receiving circuitry 603 comprises a receiver 605 for receiving a radio frequency signal and a decoder/controller 610 for recovering from the radio frequency signal a selective call message, which is thereafter temporarily stored in a memory 615. Reception of the selective call message is then announced by the activation of an alert mechanism 620, such as a transducer, by the decoder/controller 610. Thereafter, the selective call message is provided by the decoder/controller 610 to a display device 625. Preferably, the electrical connector 100 in accordance with the present invention is utilized to couple the display device 625 to the printed circuit board on which the receiving circuitry 603 is mounted. In this manner, terminations formed on the printed circuit board can be formed at a very small pitch, thereby efficiently utilizing the board space, and translated by the electrical connector 100 to terminations formed on the display device 625 at a larger pitch.

Figure 7:
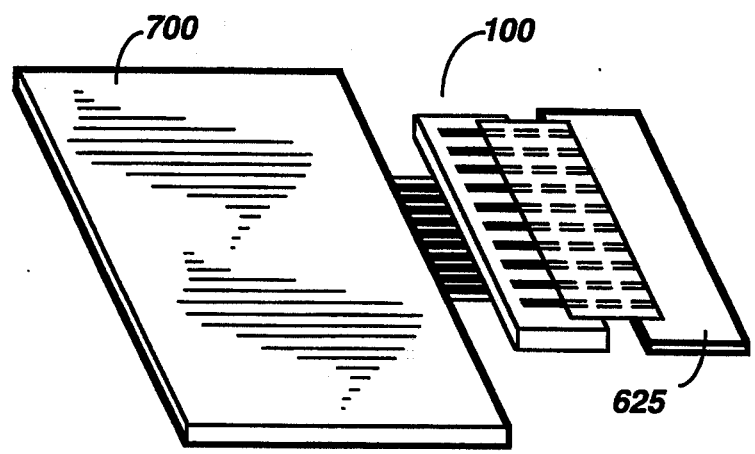
FIG. 7 is an illustration of the electrical connector of FIG. 1 when utilized to couple the first and second electronic circuits of FIG. 6 in accordance with the preferred embodiment of the present invention.
Figure 8:
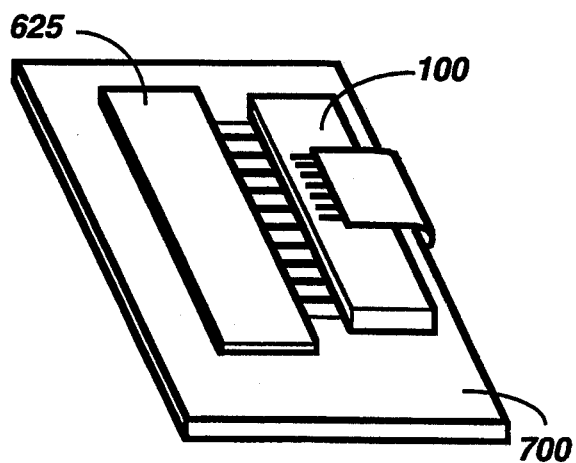
FIG. 8 is an illustration of the proper positioning of the first and second electronic circuits of FIG. 6 in accordance with the preferred embodiment of the present invention.

FIG. 7 is an illustration of the electrical connector 100 when utilized to couple the display device 625, which may be a liquid crystal display, to the printed circuit board 700 included in the radio communication device 600. In accordance with the present invention, the electrical connector 100 is both flexible and relatively short in length. Therefore, the display device 625 can be folded, as shown in FIG. 8, into a convenient position in which it rests on top of the printed circuit board 700, thereby efficiently utilizing the space within the radio communication device 600.

In summary, the electrical connector as described above includes two one-layer heat seal connectors, each having interconnects formed thereon at different pitches. Additionally, the electrical connector includes a translation circuit, which may be a rigid printed circuit board, for electrically coupling the two heat seal connectors and for translating from the interconnects formed at the first pitch to the interconnects formed at the second pitch. Because the translation circuit comprises multiple layers to effect the translation, the electrical connector according to the present invention is considerably smaller in length than conventional heat seal connectors utilized to translate between terminations of different pitches.

It may be appreciated by now that there has been provided an electrical connector which is flexible and does not require a large distance for translation from a larger pitched termination to a smaller pitched termination.

What is claimed is:

1. An electrical connector for translating from different sized connections, the electrical connector comprising a first heat seal connector comprising a first plurality of interconnects formed at a first pitch, a second heat seal connector comprising a second plurality of interconnects formed at a second pitch smaller than the first pitch, and a translation circuit which includes:

a first outer layer on which a first set of outer terminals is formed at the first pitch for aligning with and electrically coupling to the first plurality of interconnects;

a second outer layer on which a second set of outer terminals is formed at the second pitch for aligning with and electrically coupling to the second plurality of interconnects;

a first inner layer for interconnecting a first outer terminal subset and a second outer terminal subset, wherein the first outer terminal subset comprises a first portion of the first set of outer terminals and the second outer terminal subset comprises a first portion of the second set of outer terminals; and a second inner layer for interconnecting a third outer terminal subset and a fourth outer terminal subset, wherein the third outer terminal subset comprises a second portion of the first set of outer terminals and the fourth outer terminal subset comprises a second portion of the second set of outer terminals.

2. The electrical connector according to claim 1, wherein the translation circuit comprises a rigid printed circuit board.

3. The electrical connector according to claim 1, wherein the translation circuit comprises a flexible circuit formed from a polyimide material.

4. The electrical connector according to claim 1, wherein the first and second heat seal connectors are formed from a mylar material.

5. The electrical connector according to claim 4, wherein the first and second pluralities of interconnects are formed from graphite disposed on the mylar material.

6. The electrical connector according to claim 1, wherein the first inner layer comprises:
- a first set of inner terminals aligned with the first outer terminal subset;
- a first plurality of via holes for electrically coupling the first set of inner terminals to the first outer terminal subset;
- a second set of inner terminals aligned with the second outer terminal subset;
- a second plurality of via holes for electrically coupling the second set of inner terminals to the second outer terminal subset; and
- a first plurality of runners disposed on the first inner layer for electrically coupling the first and second sets of inner terminals.

7. The electrical connector according to claim 6, wherein the second inner layer comprises:
- a third set of inner terminals aligned with the third outer terminal subset;
- a third plurality of via holes for electrically coupling the third set of inner terminals to the third outer terminal subset;
- a fourth set of inner terminals aligned with the fourth outer terminal subset;
- a fourth plurality of via holes for electrically coupling the fourth set of inner terminals to the fourth outer terminal subset; and
- a second plurality of runners disposed on the second inner layer for electrically coupling the third and fourth sets of inner terminals.

8. An electronic device comprising a first electronic circuit, a second electronic circuit, and an electrical connector for electrically coupling the first and second electronic circuits, the electrical connector comprising:
- a first heat seal connector comprising a first plurality of interconnects formed at a first pitch for electrically coupling to the first electronic circuit, a second heat seal connector comprising a second plurality of interconnects formed at a second pitch smaller than the first pitch for electrically coupling to the second electronic circuit, and a translation circuit which includes:
- a first outer layer on which a first set of outer terminals is formed at the first pitch for aligning with and electrically coupling to the first plurality of interconnects;
- a second outer layer on which a second set of outer terminals is formed at the second pitch for aligning with and electrically coupling to the second plurality of interconnects;
- a first inner layer for interconnecting a first outer terminal subset and a second outer terminal subset, wherein the first outer terminal subset comprises a first portion of the first set of outer terminals and the second outer terminal subset comprises a first portion of the second set of outer terminals; and
- a second inner layer for interconnecting a third outer terminal subset and a fourth outer terminal subset, wherein the third outer terminal subset comprises a second portion of the first set of outer terminals and the fourth outer terminal subset comprises a second portion of the second set of outer terminals.

9. The electronic device according to claim 8, wherein the first electronic circuit comprises receiver circuitry for receiving and decoding a selective call message.

10. The electronic device according to claim 9, wherein the second electronic circuit comprises a display device for presenting the selective call message to a user.

11. The electronic device according to claim 8, wherein the first and second heat seal connectors are formed from a mylar material.

12. The electronic device according to claim 11, wherein the first and second pluralities of interconnects are formed from graphite disposed on the mylar material.

13. The electronic device according to claim 8, wherein the first inner layer comprises:
- a first set of inner terminals aligned with the first outer terminal subset;
- a first plurality of via holes for electrically coupling the first set of inner terminals to the first outer terminal subset;
- a second set of inner terminals aligned with the second outer terminal subset;
- a second plurality of via holes for electrically coupling the second set of inner terminals to the second outer terminal subset; and
- a first plurality of runners disposed on the first inner layer for electrically coupling the first and second sets of inner terminals.

14. The electronic device according to claim 13, wherein the second inner layer comprises:
- a third set of inner terminals aligned with the third outer terminal subset;
- a third plurality of via holes for electrically coupling the third set of inner terminals to the third outer terminal subset;
- a fourth set of inner terminals aligned with the fourth outer terminal subset;
- a fourth plurality of via holes for electrically coupling the fourth set of inner terminals to the fourth outer terminal subset; and
- a second plurality of runners disposed on the second inner layer for electrically coupling the third and fourth sets of inner terminals.

15. A radio communication device for presenting a selective call message, the ratio communication device comprising receiving circuitry for recovering the selective call message from a received radio frequency signal, a display device for presenting the selective call message, and an electrical connector for providing the selective call message from the receiving circuitry to the display device, the electrical connector including:
- a first heat seal connector comprising a first plurality of interconnects formed at a first pitch for electrically coupling to the receiving circuitry, a second heat seal connector comprising a second plurality of interconnects formed at a second pitch smaller than the first pitch for electrically coupling to the display device, and a translation circuit which includes:
- a first outer layer on which a first set of outer terminals is formed for aligning with and electrically coupling to the first plurality of interconnects;
- a second outer layer on which a second set of outer terminals is formed for aligning with and electrically coupling to the second plurality of interconnects;
- a first inner layer for interconnecting a first outer terminal subset and a second outer terminal subset, wherein the first outer terminal subset comprises a first portion of the first set of outer terminals and the second outer terminal subset comprises a first portion of the second set of outer terminals; and a second inner layer for interconnecting a third outer terminal subset and a fourth outer terminal subset, wherein the third outer terminal subset comprises a second portion of the first set of outer terminals and the fourth outer terminal subset comprises a second portion of the second set of outer terminals.

16. The radio communication device according to claim 15, wherein the first inner layer comprises:
   a first set of inner terminals aligned with the first outer terminal subset;
   a first plurality of via holes for electrically coupling the first set of inner terminals to the first outer terminal subset;
   a second set of inner terminals aligned with the second outer terminal subset;
   a second plurality of via holes for electrically coupling the second set of inner terminals to the second outer terminal subset; and
   a first plurality of runners disposed on the first inner layer for electrically coupling the first and second sets of inner terminals.

17. The radio communication device according to claim 16, wherein the second inner layer comprises:
   a third set of inner terminals aligned with the third outer terminal subset;
   a third plurality of via holes for electrically coupling the third set of inner terminals to the third outer terminal subset;
   a fourth set of inner terminals aligned with the fourth outer terminal subset;
   a fourth plurality of via holes for electrically coupling the fourth set of inner terminals to the fourth outer terminal subset; and
   a second plurality of runners disposed on the second inner layer for electrically coupling the third and fourth sets of inner terminals.

* * * * *

UNITED STATES PATENT AND TRADEMARK OFFICE
CERTIFICATE OF CORRECTION

PATENT NO. : 5,346,401
DATED : September 13, 1994
INVENTOR(S) : John Delianides, Cindy L. Davis It is certified that error appears in the above-indentified patent and that said Letters Patent is hereby corrected as shown below:

Column 8, line 41, delete "ratio" and insert --radio--.

Signed and Sealed this

Twenty-seventh Day of December, 1994

Attest:

BRUCE LEHMAN

Attesting Officer     Commissioner of Patents and Trademarks